(12) United States Patent
Yang et al.

(10) Patent No.: US 8,247,258 B2
(45) Date of Patent: Aug. 21, 2012

(54) METHOD OF INTERCONNECT FOR IMAGE SENSOR

(75) Inventors: Jianping Yang, Shanghai (CN); Hong Zhu, Shanghai (CN); Jieguang Huo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 502 days.

(21) Appl. No.: 12/259,172

(22) Filed: Oct. 27, 2008

(65) Prior Publication Data
US 2010/0197066 A1    Aug. 5, 2010

(30) Foreign Application Priority Data
Jul. 15, 2008    (CN) .......................... 2008 1 0040740

(51) Int. Cl.
*H01L 21/00*    (2006.01)
(52) U.S. Cl. ................ 438/59; 438/60; 438/75; 438/98; 438/199; 438/237; 257/E21.639
(58) Field of Classification Search .................. None
See application file for complete search history.

(56) References Cited

U.S. PATENT DOCUMENTS

| | | | |
|---|---|---|---|
| 5,389,809 A * | 2/1995 | Haken et al. ................ | 257/344 |
| 6,534,356 B1 | 3/2003 | Yang et al. | |
| 6,894,350 B2 * | 5/2005 | Shimizu et al. ............... | 257/343 |
| 2005/0072994 A1 | 4/2005 | Jeon | |

FOREIGN PATENT DOCUMENTS

CN    1819239 A    8/2006

* cited by examiner

*Primary Examiner* — Kyoung Lee
(74) *Attorney, Agent, or Firm* — Kilpatrick Townsend and Stockton LLP

(57) ABSTRACT

A method for fabricating CMOS image sensor device includes providing a P-type semiconductor substrate. The semiconductor substrate includes a surface region. The method includes forming a first dielectric layer having a first thickness overlying a first region of the semiconductor substrate. The method includes providing an N type impurity region in a portion of the semiconductor substrate underneath the first dielectric layer to cause formation of a photodiode device region characterized by at least the N type impurity region and the P type substrate. A second dielectric layer having a second thickness is formed in a second region of the surface region. The second dielectric layer is formed within a portion of the first region within the first thickness of the first dielectric layer. The method includes forming a polysilicon gate layer overlying at least the second region to form a contact member coupled to the second region.

17 Claims, 8 Drawing Sheets

METHOD OF INTERCONNECT FOR IMAGE SENSOR

CROSS-REFERENCE TO RELATED APPLICATIONS

This application claims priority to Chinese Application No. 200810040740.2, filed Jul. 15, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method and a structure for manufacturing a CMOS image sensor device having a reduced dark current characteristics for advanced application. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is, a given process typically only works down to a certain feature size, and then either the process or the device layout needs to be changed.

An example of such a limit is in image sensors. As demand for pixel sensitivity and pixel density increases in consumer applications, pixel layout and related integrated circuit design become more critical. These and other limitations will be described in further detail throughout the present specification and more particularly below.

From the above, it is seen that an improved technique for processing semiconductor image sensor devices is desired.

BRIEF SUMMARY OF THE INVENTION

According to embodiments of the present invention, a method of forming a CMOS image sensor device is provided. More particularly, the invention provides a method and structure for manufacturing a CMOS image sensor device free of non-light transmitting contact region and having a reduced dark current. But it would be recognized that the invention has a much broader range of applicability. For example, the method can be applied to manufacturing other integrated circuits such as logic devices, memory devices, and others.

In a specific embodiment, the present invention provide a method for manufacturing CMOS image sensor having a reduced dark current and an improved pixel fill factor. The method includes providing a semiconductor substrate having a P type impurity characteristic. For example, the P type impurity may be provided using boron as an dopant. The method includes forming a first gate dielectric layer having a first thickness overlying a first portion of the semiconductor substrate. The first gate dielectric layer is often formed using a high quality silicon oxide such as a grown thermal oxide. Other dielectric materials such as silicon nitride or a combination may also be used depending on the application. The method includes providing a N type impurity in a portion of the semiconductor substrate. The N type impurity is provided underneath the first dielectric layer. The N type impurity and the P type impurity cause the formation of a photodiode device region in the semiconductor substrate. In a specific embodiment, the method forms a second dielectric layer within a portion of the first portion of the semiconductor substrate. The second dielectric layer has a second thickness. In a specific embodiment, the method includes forming a gate layer coupled to the second region overlying the at least the second region. The gate layer comprises a polysilicon material in a specific embodiment.

Many benefits are achieved by way of the present invention over conventional techniques. For example, the present technique provides an easy to use process that relies upon conventional technology. In some embodiments, the method provides higher device reliability and performance. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to embodiments of the present invention, a method of forming a CMOS image sensor device is provided. More particularly, the invention provides a method and structure for manufacturing a CMOS image sensor device free of contact region and having a reduced dark current. But it would be recognized that the invention has a much broader range of applicability. For example, the method can be applied to manufacturing other integrated circuits such as logic devices, memory devices, and others.

CMOS image sensor device is emerging as the preferred device technology for digital consumer applications. To enable improved pixel sensing performance, CMOS image sensor technology requires improved pixel layout design and integrated circuit processing, among others. Dark current is a major factor influencing sensor performance especially under a low light condition. Factors that may contribute to dark current include defects on the silicon surface and silicon-gate oxide interface in photodiode regions and surrounding regions. Additionally, certain electrode structure connecting photodiode region and peripheral circuitry may decrease pixel fill factor (percentage of pixels that is sensitive to light) further limiting sensitivity of the imaging device. Such limitations and others will be described in more detail throughout the specification and particularly below.

Figure 1:
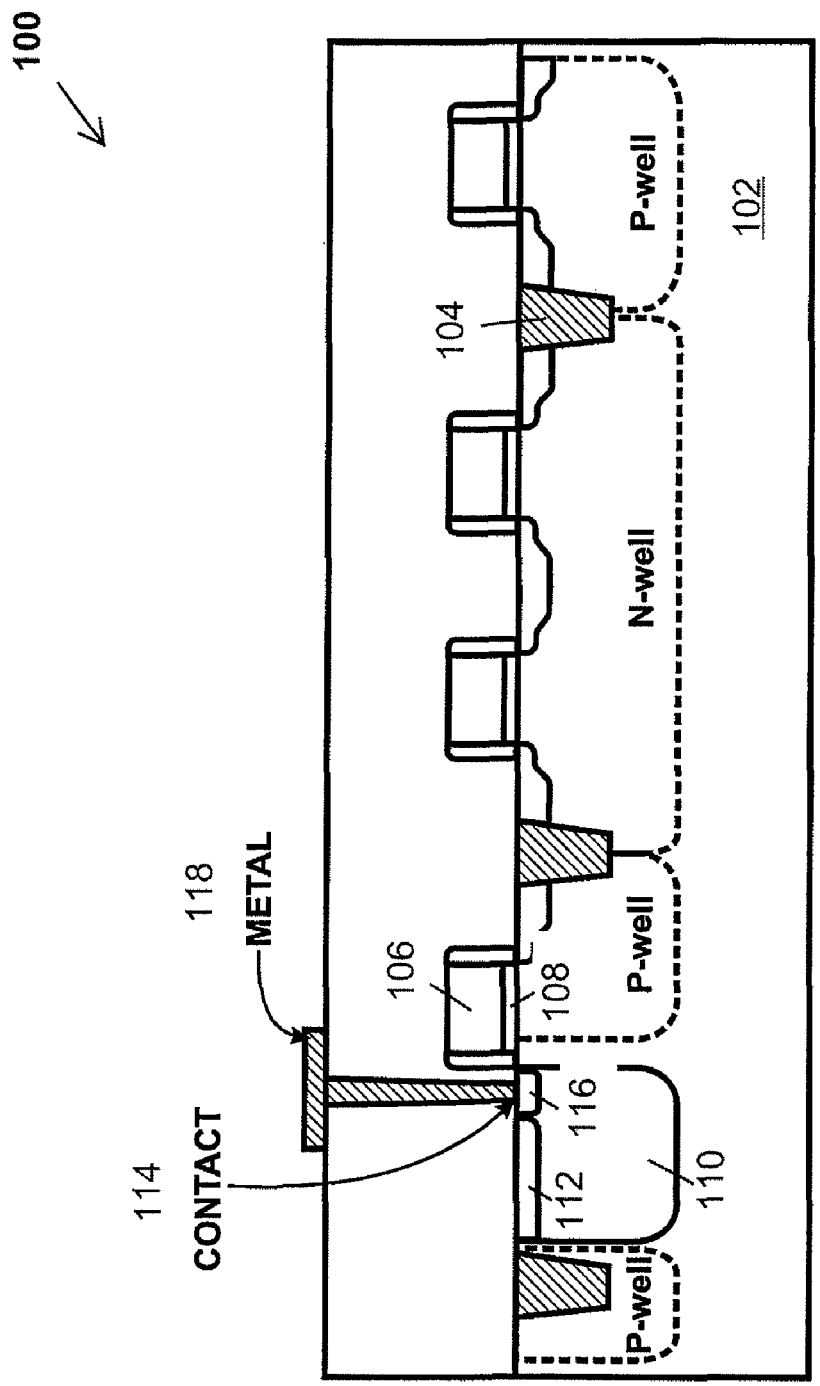
FIG. 1 is a simplified diagram illustrating a CMOS image sensor according to a conventional method of forming the CMOS image sensor.

FIG. 1 is a simplified diagram illustrating a CMOS image sensor 100 according to a conventional fabrication method. As shown, The conventional CMOS image sensor includes a semiconductor substrate 102. The semiconductor substrate can be a silicon wafer doped with a P type impurity. The conventional CMOS image sensor also include isolation regions 104 in portions of the semiconductor substrate. As shown in FIG. 1, at least one gate structure 106 is formed overlying a gate dielectric 108 overlying the semiconductor substrate. The gate dielectric is usually formed using a grown thermal oxide. The conventional CMOS image sensor also includes a photosensitive region 110. The photosensitive region is formed using a N type impurity region and the P type impurity. A P impurity region 112 is also provided in a surface region of the photosensitive region to form a pinned photodiode structure. The pinned photodiode reduces certain dark current in the convention CMOS image sensor device. As shown, a contact region 114 is formed overlying a diffusion region 116 in a portion of the photosensitive region. A metal pad 118 is formed overlying the contact region to provide connection between the photosensitive region and other active region or periphery circuitry. The metal pad decreases pixel fill factor and the sensitivity of the imaging device. These and other limitation of the conventional method for fabricating CMOS image sensor device will be described in more detailed below.

Figure 2:
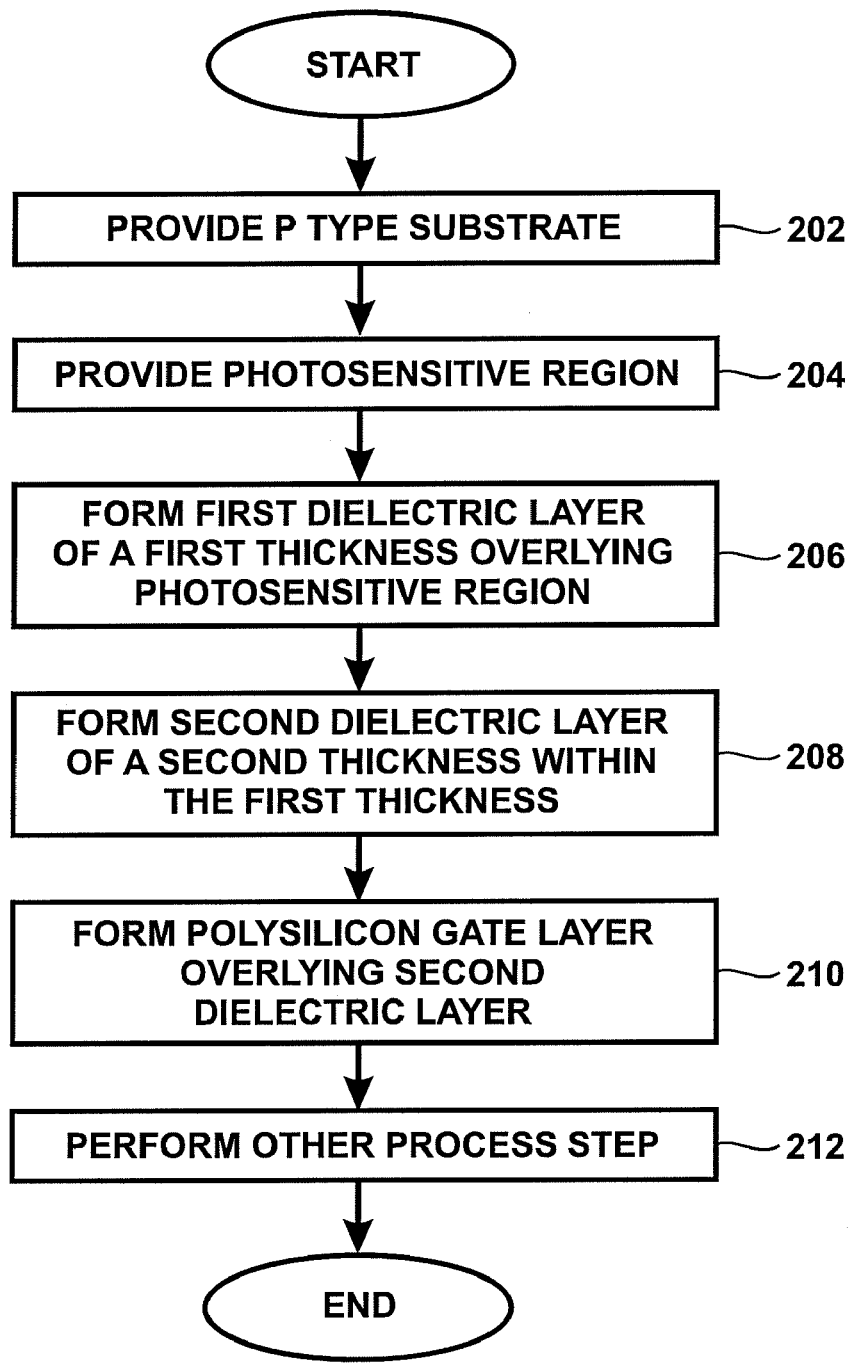
FIG. 2 is a simplified flow diagram for a method to form a CMOS image sensor according to an embodiment of the present invention.

FIG. 2 is a simplified flow diagram illustrating a method of fabricating a CMOS image sensor device according to an embodiment of the present invention. The diagram is merely an example and should not unduly limit the scope herein. One skilled in the art would recognize other variations, modifications, and alternatives. As shown, the method provides a semiconductor substrate doped with a P type impurity (Step 202). The semiconductor substrate can be a silicon wafer, a silicon on insulator substrate, a silicon germanium substrate and the like. The method provides a photosensitive region in a portion of the semiconductor substrate (Step 204). The photosensitive region is formed using at least an N type impurity region in the semiconductor substrate and the P type impurity. The method forms a first dielectric layer of a first thickness (Step 206) overlying a surface region of the semiconductor substrate. The first dielectric layer can be formed using a grown thermal oxide in a specific embodiment. Other dielectric materials may also be used. The method forms a second dielectric layer of a second thickness overlying the photosensitive region in a second portion within the thickness of the first dielectric layer (Step 208). The method includes forming a gate layer (Step 210) overlying at least the second portion of the photosensitive region. In a specific embodiment, the gate layer may be made of a polysilicon material. The method continues with other process steps to complete the CMOS image sensor device (Step 212). Of course, there can be other variations, modifications, and alternatives.

The above sequence of steps provide a method of forming a CMOS image sensor according to an embodiment of the present invention. Alternatively, one or more additional steps may be added, one or more steps may be deleted, one or more steps may be provided in a different sequence without departing from the scope of the claims herein. One skilled in the art would recognize other variations, modifications, and alternatives.

Figure 3:
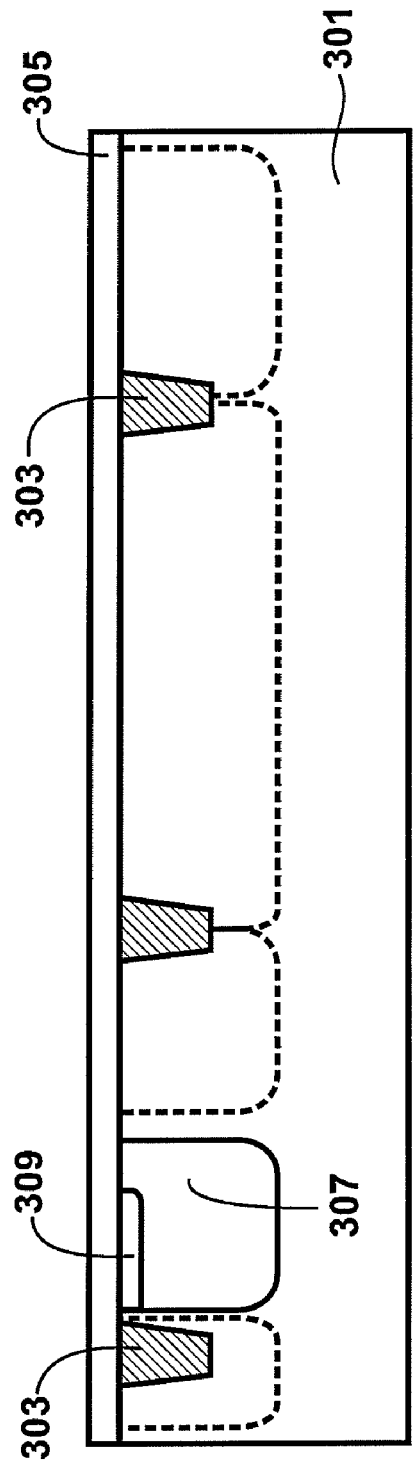
FIG. 3-10 are simplified diagrams illustrating a method for forming a CMOS image sensor according to an embodiment of the present invention.

FIGS. 3-10 illustrate a method of forming a CMOS image sensor according to an embodiment of the present invention. As shown in FIG. 3, a P type semiconductor substrate 301 is provided. The semiconductor substrate can be single crystal silicon, silicon germanium, silicon on insulator (SOI), and the like. The method forms isolation regions 303 in the semiconductor substrate. In a specific embodiment, isolation regions may be provided using shallow trench isolation commonly called STI. Shallow trench isolation may be formed using patterning, etching, and a dielectric fill. The method includes forming a first gate dielectric layer 305 overlying the semiconductor substrate. Other dielectric materials may also be used. These other dielectric materials may include silicon nitride, composite such as an ONO stack depending on the application. The method includes forming a photosensitive region 307 within a portion of the semiconductor substrate. The photosensitive region can be formed using an impurity opposite in polarity to the impurity of the semiconductor substrate. For example, the photosensitive device region can be doped using an N type impurity for the P type substrate. Examples of the N type impurity includes arsenic, phosphorus, antimony, and the like. In a specific embodiment, the photosensitive device region may use a pinned photodiode structure to reduce surface dark leakage current. The pinned photodiode structure includes a P type impurity region 309 in a surface region of the photosensitive region. Of course, there can be other variations, modifications, and alternatives.

Figure 4:
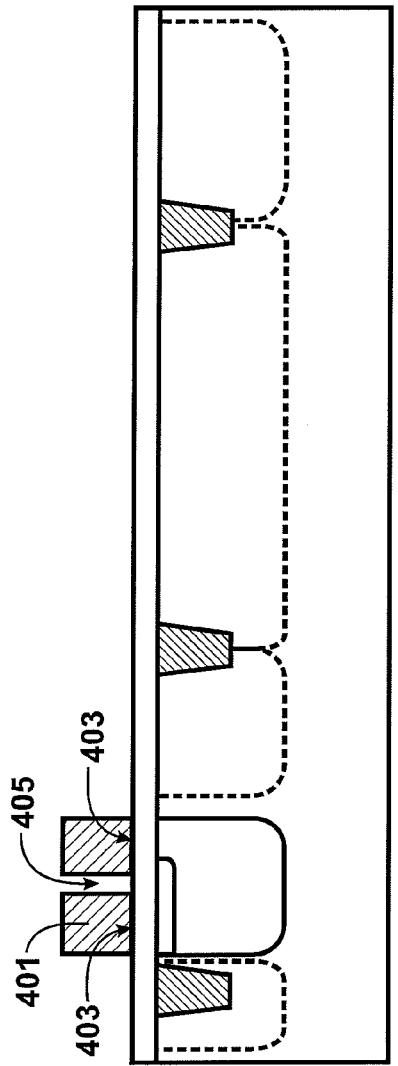
Figure 5:
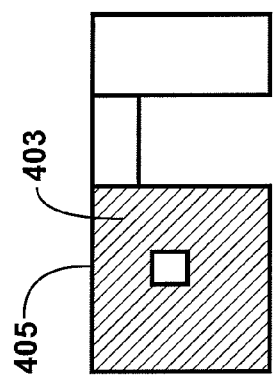

In a specific embodiment, the method includes forming a masking layer 401 overlying a portion of the first dielectric layer as shown in FIG. 4. The portion of the first dielectric layer overlies a first portion 403 of the photosensitive region. The first dielectric layer overlying at least a second portion 405 of the photosensitive region 307 is exposed as shown in FIG. 4. The masking layer can be provided using a photoresist material in a specific embodiment. FIG. 5 illustrates a top view of FIG. 4.

Figure 6:
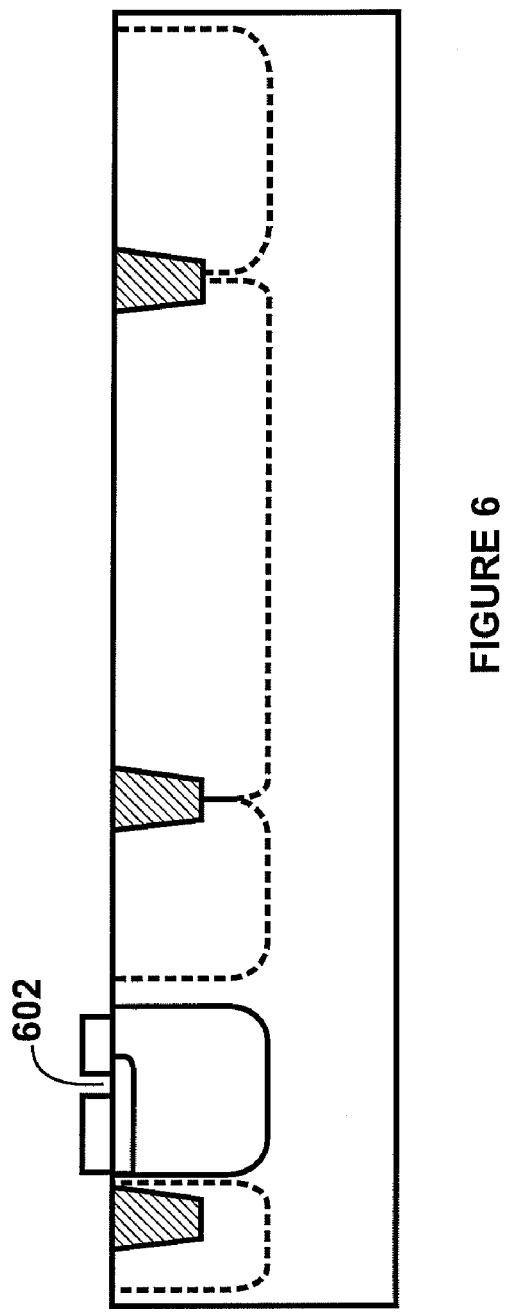

As shown in FIG. 6, the method performs an etching process to remove the exposed portion of the first dielectric layer. The etching process can be provided using a dry etch process in a plasma environment. Other etching processes such as a wet etch may also be used depending on the application. As shown, the etching process removes the exposed portion of the first dielectric layer exposing a portion 602 of the semiconductor substrate in the photosensitive region. Portion 602 includes at least the first portion of the photosensitive device region.

Figure 7:
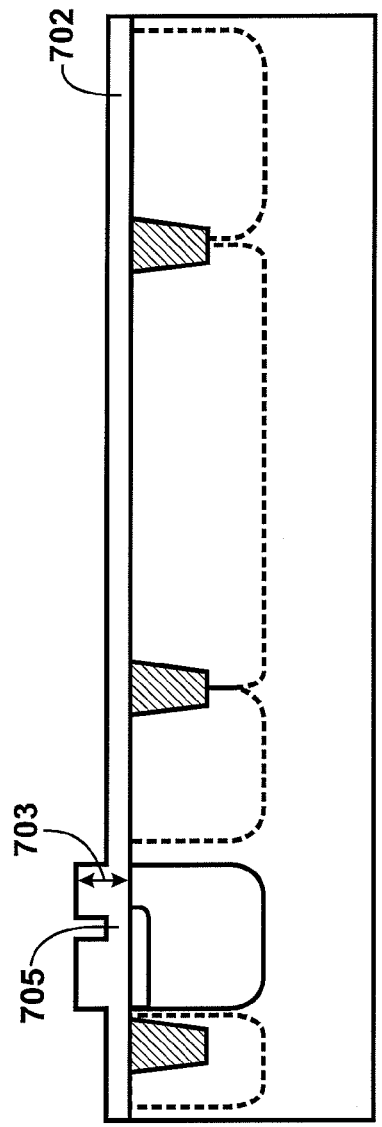
Figure 8:
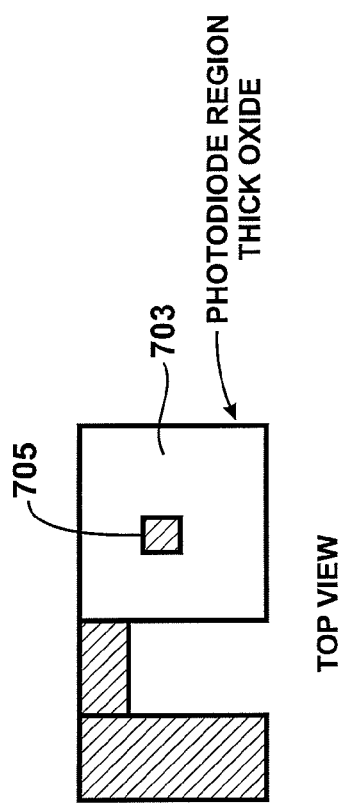

In a specific embodiment, the method includes forming a second gate dielectric 701 layer overlying the semiconductor substrate as shown in FIG. 7. As shown, the second gate dielectric layer has a second thickness 703 overlying the first portion of the photosensitive region. The second gate dielectric layer also has a third thickness 705 overlying at least the second portion of the photosensitive region and active regions of the CMOS image sensor device. The third thickness is less than the second thickness in a specific embodiment. FIG. 8 illustrates a partial top view of the photodiode device region as illustrated in FIG. 7. Of course, there can be other variations, modifications, and alternatives.

Figure 9:
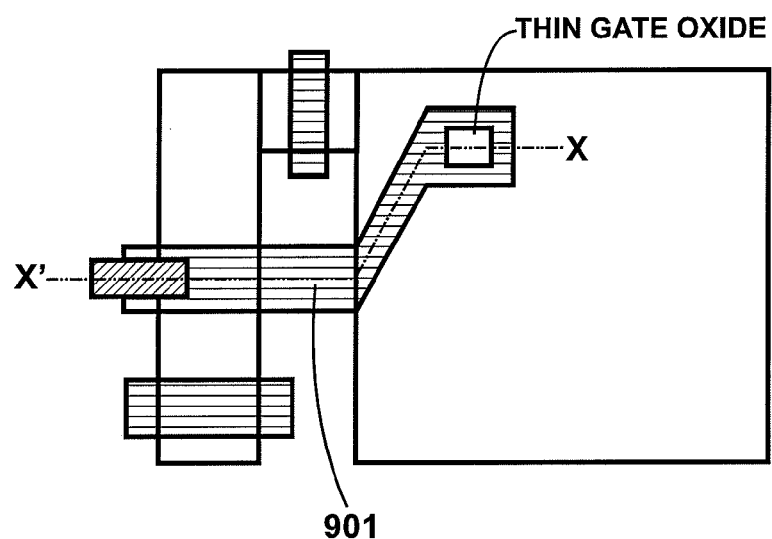

Effectively, the second gate dielectric layer provides a dual gate structure for the CMOS image sensor device in a specific embodiment. Referring to FIG. 9, the method includes forming at least a first gate layer 901 using a doped polysilicon material overlying portions of the second gate dielectric layer. The portion of the second gate dielectric layer includes at least the second gate dielectric layer overlying the second portion of the photosensitive region. As shown, the first gate layer is coupled to a diffusion region in the photosensitive region through the second gate dielectric layer overlying the second portion of the photosensitive region using a capacitor. In a specific embodiment, the first gate layer forms a contact member to provide for an electrode to couple signal from the diffusion region within the photosensitive region to a source follower gate of, for example, a buffer transistor. In an alternative embodiment, the second portion of the photosensitive region can also be an open area, that is, the second dielectric layer is removed from the second portion of the photosensitive region to provide for the contact element to be in direct contact with the diffusion region of the photosensitive region. Of course, there can be other variations, modifications, and alternatives.

Figure 10:
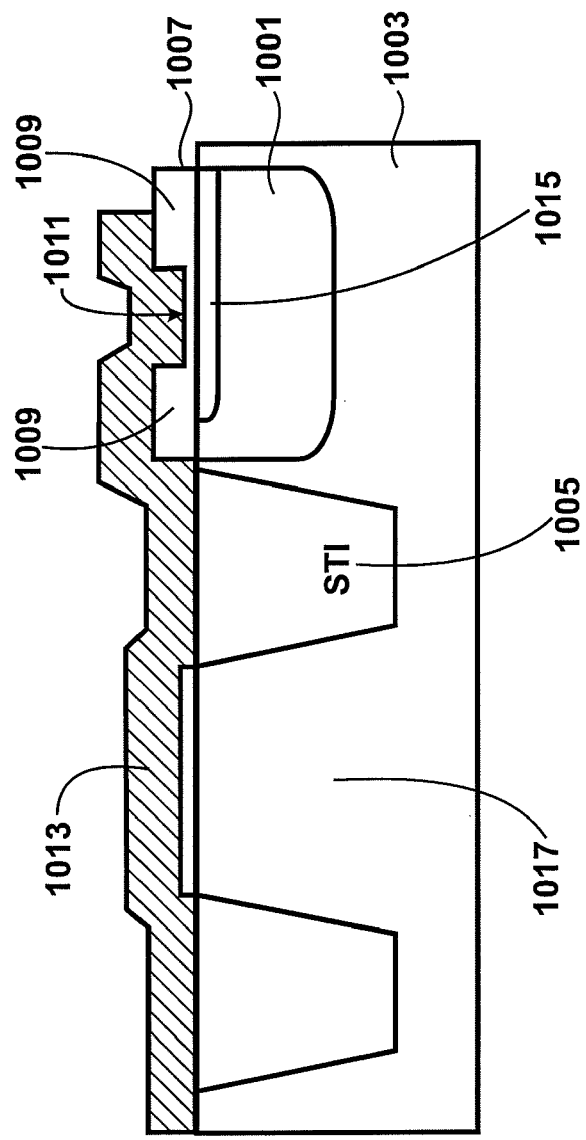

FIG. 10 is a simplified cross section view along X-X' of the CMOS image sensor device in FIG. 9. The diagram is merely an example and should not unduly limit the scope of the invention. One of ordinary skill in the art would recognize many other variations, modifications, and alternatives. As shown, the CMOS image includes a photosensitive region 1001 provided in a semiconductor substrate 1003. The CMOS image sensor device also includes shallow trench isolation (STI) regions 1005. As shown, the CMOS image sensor device includes a gate dielectric layer 1007. Gate dielectric layer 1007 includes a thick oxide region 1009 and a thin oxide region 1011. A gate structure 1013 is formed using a polysilicon material overlying at least the thin oxide region overlying the photosensitive region. The gate structure provides a contact element for the interconnect between a diffusion region 1015 within the photosensitive region and an active region 1017. In specific embodiment, the polysilicon gate structure eliminates an otherwise opaque metal structure. The polysilicon material has a light transmission characteristic that does not impact pixel fill factor of the CMOS image sensor device. Of course there can be other variations, modifications, and alternatives.

While the above is a full description of the specific embodiments, various modifications, alternative constructions and equivalents may be used. For example, the above specification has been described using a P type substrate and a photodiode device region using a N type impurity, an N type substrate and a photodiode device region using P type impurity can also be used. Additionally, the isolation region can be formed using other isolation structures such as a field oxide region among others. Therefore, the above description and illustrations should not be taken as limiting the scope of the present invention which is defined by the appended claims.

What is claimed is:

1. A method for fabricating a CMOS image sensor device, the method comprising:
    providing a P-type semiconductor substrate having a P type impurity, the semiconductor substrate including a surface region;
    forming a first dielectric layer having a first thickness overlying a first region of the semiconductor substrate;
    providing an N type impurity region in a portion of the semiconductor substrate underneath the first dielectric layer to cause formation of a photodiode device region characterized by at least the N type impurity region and the P type semiconductor substrate;
    forming a second dielectric layer having a second thickness in a second region of the surface region, the second thickness being formed within a portion of the first region, the portion being within the first thickness of the first dielectric layer; and
    forming a gate layer overlying at least the second region to form a contact element coupled to the second region, the gate layer comprising a polysilicon material;
    wherein the contact element provides an interconnect member between the photodiode device region and a transistor of the CMOS image sensor device.

2. The method of claim 1 wherein the second region is a diffusion region of the photodiode device region.

3. The method of claim 1 wherein the semiconductor substrate is a silicon wafer.

4. The method of claim 1 wherein the P type impurity is boron.

5. The method of claim 1 wherein the N type impurity is selected from the group comprising phosphorus, arsenic, or antimony.

6. The method of claim 1 wherein the second thickness is less than the first thickness.

7. The method of claim 1 wherein the first dielectric layer comprises silicon dioxide.

8. The method of claim 1 wherein the second dielectric layer comprises silicon dioxide.

9. The method of claim 1 wherein the polysilicon material is doped with phosphorus.

10. The method of claim 1 herein the gate layer is isolated from the substrate using a spacer structure.

11. The method of claim 1 wherein forming a first dielectric layer comprises a thermal oxidation growth process.

12. The method of claim 1 wherein the photodiode device region comprises a pinned photodiode structure.

13. A method for fabricating a CMOS image sensor device, the method comprising:
    providing a P-type semiconductor substrate having a P type impurity, the semiconductor substrate including a surface region;
    forming a first dielectric layer having a first thickness overlying a first region of the semiconductor substrate;
    providing an N type impurity region in a portion of the semiconductor substrate underneath the first dielectric layer to cause formation of a photodiode device region characterized by at least the N type impurity region and the P type semiconductor substrate;
    forming a second dielectric layer having a second thickness in a second region of the surface region, the second thickness being formed within a portion of the first region, the portion being within the first thickness of the first dielectric layer; and
    forming a gate layer overlying at least the second region to form a contact element configured to couple the N-type impurity region within the photodiode device region to a transistor in the second region.

14. The method of claim 13 wherein the gate layer comprises a polysilicon material.

15. The method of claim 13 wherein the gate layer is transmissible to light.

16. The method of claim 13 wherein the second thickness is less than the first thickness.

17. The method of claim 13 wherein the contact element is in direct contact with the N type impurity region of the photodiode device region.

* * * * *